United States Patent
Degani et al.

(10) Patent No.: US 6,370,766 B1
(45) Date of Patent: *Apr. 16, 2002

(54) MANUFACTURE OF PRINTED CIRCUIT CARDS

(75) Inventors: Yinon Degani, Highland Park; Thomas Dixon Dudderar, Chatham; Dean Paul Kossives, Glen Gardner; Yee Leng Low, Chatham, all of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/807,266

(22) Filed: Feb. 28, 1997

(51) Int. Cl.⁷ .................................................. H05K 3/30
(52) U.S. Cl. ......................... 29/832; 29/840; 361/748; 361/760; 361/775
(58) Field of Search .......................... 29/832, 834, 836, 29/840, 852; 361/748, 760, 775

(56) References Cited

U.S. PATENT DOCUMENTS 4,580,193 A * 4/1986 Edwards .................... 361/775

* cited by examiner

*Primary Examiner*—Peter Vo
*Assistant Examiner*—Rick Kiltae Chang
(74) *Attorney, Agent, or Firm*—Peter V. D. Wilde; Thomas, Kayden, Horstemeyer & Risley LLP

(57) ABSTRACT

The specification describes methods for the manufacture of printed circuit cards which allow for final testing, including burn-in if required, of multiples of printed circuit cards as an integrated process panel prior to final packaging and singulation. This desired sequence of operations is made possible by the addition of arrays of test contacts at the edge of the integrated process panel where the test contacts can be accessed with an insertion test apparatus.

9 Claims, 7 Drawing Sheets

MANUFACTURE OF PRINTED CIRCUIT CARDS

FIELD OF THE INVENTION

This invention relates to printed circuit technology and more specifically to plug-in circuit cards, e.g. memory cards, for computers.

BACKGROUND OF THE INVENTION

With rapidly advancing computer technology it is now conventional for computers, especially personal computers, to allow customizing, i.e. upgrades, enhancements, additions etc., of new accessories or system software improvements by simply installing new printed circuit cards in an existing computer. Such options include expansion boards, single in-line memory modules (SIMM), external peripherals for multimedia, modems, printers, fax, video DRAM chips, system processor upgrades, etc. This same capacity to use plug-in expansion boards or cards also allows easy assembly and repair of basic computer components that are typically part of the computer when purchased, e.g. hard disks, CD-ROM readers and diskette drives.

The printed circuit plug-in boards or cards, hereinafter referred to as printed circuit cards (PC cards), are printed circuit boards carrying many integrated circuit packages. To fit the typical computer housing the cards are rectangular in shape with a relatively long side along which is disposed at least one row of I/O contacts.

The computer housing is provided with plug-in sites, typically referred to as PCI or ISA slots, for installing repair or expansion PC cards. These sites have rectangular slots, with channels typically along two or three sides, for mounting the cards. The slots have at least one socket with a linear array of contacts. The socket portion of the slot is typically positioned to engage the I/O contacts along the long dimension of the card, and is situated along the floor of the computer housing for a vertical card installation, or along a sidewall or partition in the computer for a horizontal card installation. The cards have a linear array of contacts that corresponds to the linear array of the socket so that when the cards are installed the contacts of the cards mate with, or plug into, the linear array of contacts in the socket. The size and spacing of the contacts on both the socket and the cards conform to industry standards.

The manufacture of the expansion or repair cards is typically a batch process in which multiples of cards are processed as a batch on a common processing panel. At a late stage in the manufacturing sequence, typically after the component packages are inserted (or placed) and soldered, the individual cards are singulated. The singulation step involves cutting the common processing panel into single PC cards. The individual PC cards are then subjected to final testing. In the manufacture of many high performance PC boards the electrical testing may include a burn-in test.

Electrical testing of these high performance PC cards is preferably carried out using an insertion type test apparatus. The contacts on the test apparatus may be designed for conventional plug insertion, but are more likely to be zero force insertion contacts. For the purpose of this description, these types of testers are termed insertion testers or insertion test apparatus. Insertion type testers require direct access to the row of I/O contact pads by a corresponding row of test contact pads in the insertion tester. An insertion type test apparatus requires the contacts being accessed to be situated at the edge of the card where they can be inserted into the mating array of test contacts. In a typical common processing panel, many or most of the electrical contacts that require addressing for the test are not situated at the edge of the panel and these contacts are not suitable for testing with an insertion type test apparatus. Therefore, it is the common practice in the manufacture of PC cards to singulate the multiple PC cards from the common process panel for insertion testing. It is evident that singulating the PC cards involves considerable handling, leading to both higher costs of manufacture, and increased defects and failures. It would be desirable to test the PC cards while still integrated as a common processing panel so that final packaging and testing can be performed as a batch process.

While multiple cards on a common test panel can be tested using a "bed of nails" tester, reliable electrical testing requires direct electrical contact over a significant area of the I/O contact pad. Moreover, in testing high reliability IC devices it is desirable to use burn-in test procedures. Bed of nails testers are not useful under burn-in conditions because the contact area between the nails and the pads being probed is very small and the electrical resistance varies widely under the severe conditions of the burn-in test. Reliable burn-in tests require direct electrical contact with an insertion type tester so that electrical contact occurs over a substantial part of the I/O pad.

The ability to process and test PC cards as a batch, i.e. as a single integrated panel, is especially attractive in processes where final packaging can also be completed in a batch operation. Final packaging of some devices in current manufacture, e.g. certain SIMM devices with flip-chip mounting, involves epoxy underfill of the flip-chip substrates. After the application of the epoxy underfill it is difficult and in some cases impractical to remove a defective device for repair or replacement. Accordingly it is important to complete testing, including burn-in if necessary, prior to application of the epoxy underfill. Since it is considerably more convenient and cost effective to apply the underfill in a batch process it is evident from this standpoint as well as that already discussed that a testing procedure that allows both testing and final packaging to be performed in a common batch operation would be an important advance in the art.

SUMMARY OF THE INVENTION

We have developed a batch testing technique for PC cards in which multiple PC cards are processed as a common processing panel, and the processing panel is subjected to electrical testing, including burn-in testing if desired. The PC cards thereafter undergo further assembly and packaging steps as necessary while still integrated as a single processing panel. The enabling feature for this advance is the provision of rows of additional test contacts along at least one of the short edges of the card, or on the processing panel alongside at least one of the short edges of the card, so that the rows of test contacts are accessible to contact pads in a test apparatus. This allows electrical contacts to every component on the multiple card sites to be inserted into an insertion type tester thus enabling reliable and robust electrical testing, including burn-in testing if required. The added row or rows of test contacts can be eliminated in the singulation step.

DETAILED DESCRIPTION

Figure 1:
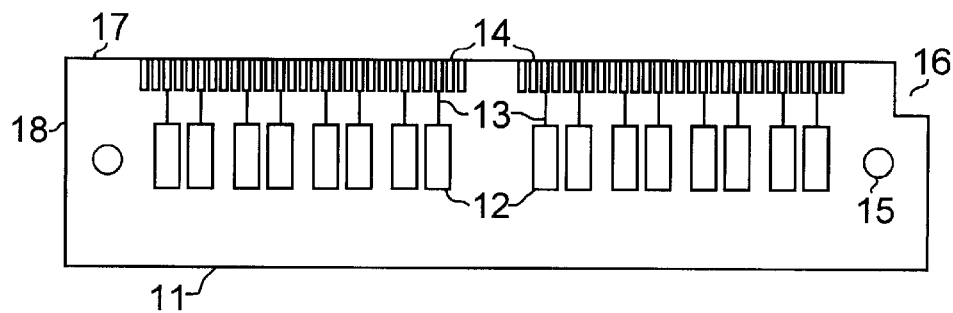
FIG. 1 is a view of a conventional SIMM PC showing the edge mounted row of I/O contacts.

Referring to FIG. 1, an example of a conventional PC card is shown with IC components 12 affixed to the printed circuit board 11. Printed circuit runners are shown at 13 interconnecting the components 12 to the row of I/O contacts 14. A typical PC card may be provided with holes 15 for handling or mounting the card, and cutout 16 that serves as an orientation index to prevent the card from being inserted backwards in the computer. Conventional PC cards are rectangular, as earlier described, with a relatively long edge 17, and a relatively short side 18. The edge 17, appearing here as the top edge, is actually the bottom or side edge when the card is inserted in the computer. The ratio of length to width of the typical card varies, but is generally at least 1.5 to 1. To maximize the number of contact pads in the row 14, for a given width of contact, metal runners from the leads of the components 12 extend to the long edge 17 of the printed circuit board 11. For simplicity, in the figures of this description a single lead is shown from each component. This is representative of one or more leads from each component in an actual PC card. Interconnection between the components also are not shown in the schematic representation but may and probably would be part of a commercial embodiment. It should also be understood that the printed circuit boards typically used in these assemblies are multilevel boards.

Figure 2:
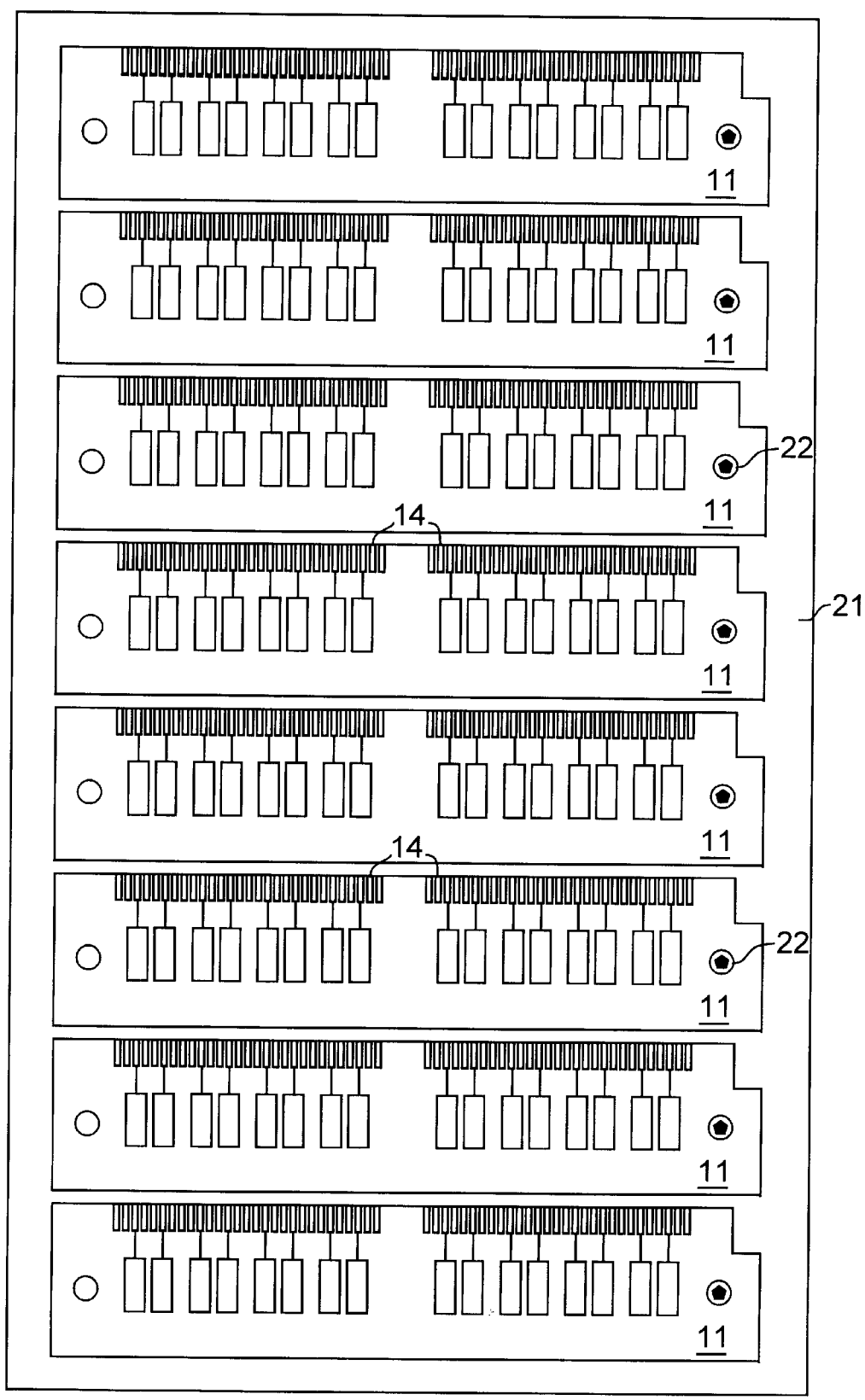
FIG. 2 is a view of a plurality of PC cards integrated as a common processing panel.

In the manufacture of PC cards, a multiplicity of cards sites are formed on a common processing panel as described earlier. In FIG. 2, eight PC card sites, indicated generally at 11, are shown on a common processing panel 21.

Means for mounting the common processing panel during processing is shown at 22. The input/output linear array of contacts for electrically accessing the panel in the service environment is shown at 14. Although eight card sites are shown for illustration the number in practice can be more or less. At least three cards are typically processed in a batch in order to obtain the advantages of batch processing, and batch processing three cards would normally introduce the problem to which the invention is directed.

Referring again to FIG. 2, it will be evident on inspection that while the arrangement shown is convenient for insertion and soldering etc. of the components, this configuration does not allow most of the rows of I/O contacts 14 to be accessed with insertion type test equipment. Accordingly, each card 11 must be singulated from the common processing panel 21 for insertion mounting in the test apparatus. In the singulation step the cards are cut or separated from the common processing panel 21 along the lines indicated using for example, a conventional router or a scribe and break technique.

Figure 3:
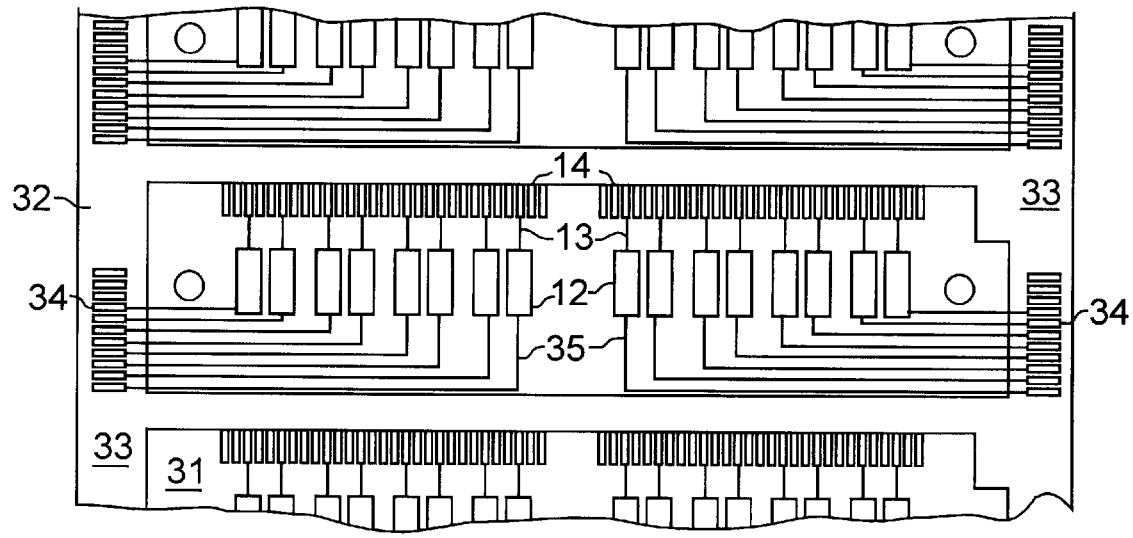
FIG. 3 is a view similar to that of FIG. 1 showing a modified PC card according to the invention.

According to the invention, and as illustrated in FIG. 3, the individual card sites 33 are provided on a common processing panel 32 as before, but the processing panel 32 is provided with rows of contacts 34 arrayed along the sides of the card sites. These added rows are designed and intended for testing. Runners 35 from the components 12 are routed to the rows of test contacts 34. The permanent interconnections 13 between the components 12 and the I/O contacts 14 remain as the functional interconnections for the finished PC cards. The common processing panel 32 in this embodiment is provided with a wide edge portion 33 to accommodate the added rows of temporary contacts.

Figure 4:
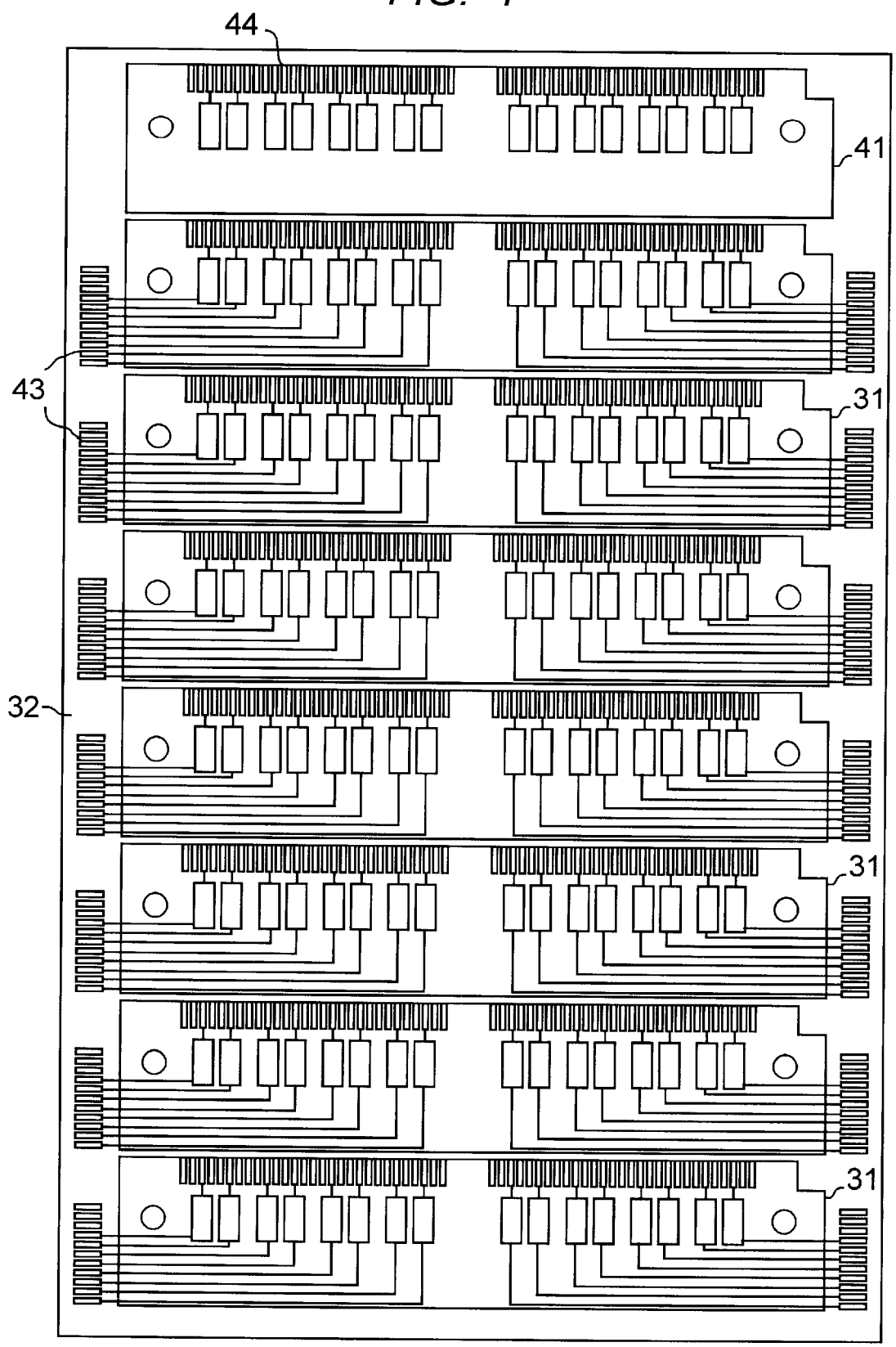
FIG. 4 is a view similar to that of FIG. 2 showing a plurality of modified PC cards integrated as a common processing panel for testing in accordance with the principles of the invention.

The full array of eight PC cards of the kind just described in connection with FIG. 3 is shown in FIG. 4. The card sites 31 are shown with the added runners to the sides of the cards, and the common processing panel 32 is shown with the added rows of test contacts to access each of the card sites except for card 41 which may be tested by accessing the row of permanent contacts 44 along the long side of the card. Card 41 is shown without the added runners to illustrate this option. However, it may be as convenient to provide all cards with the added runners and access all the cards in the same way.

Figure 5:
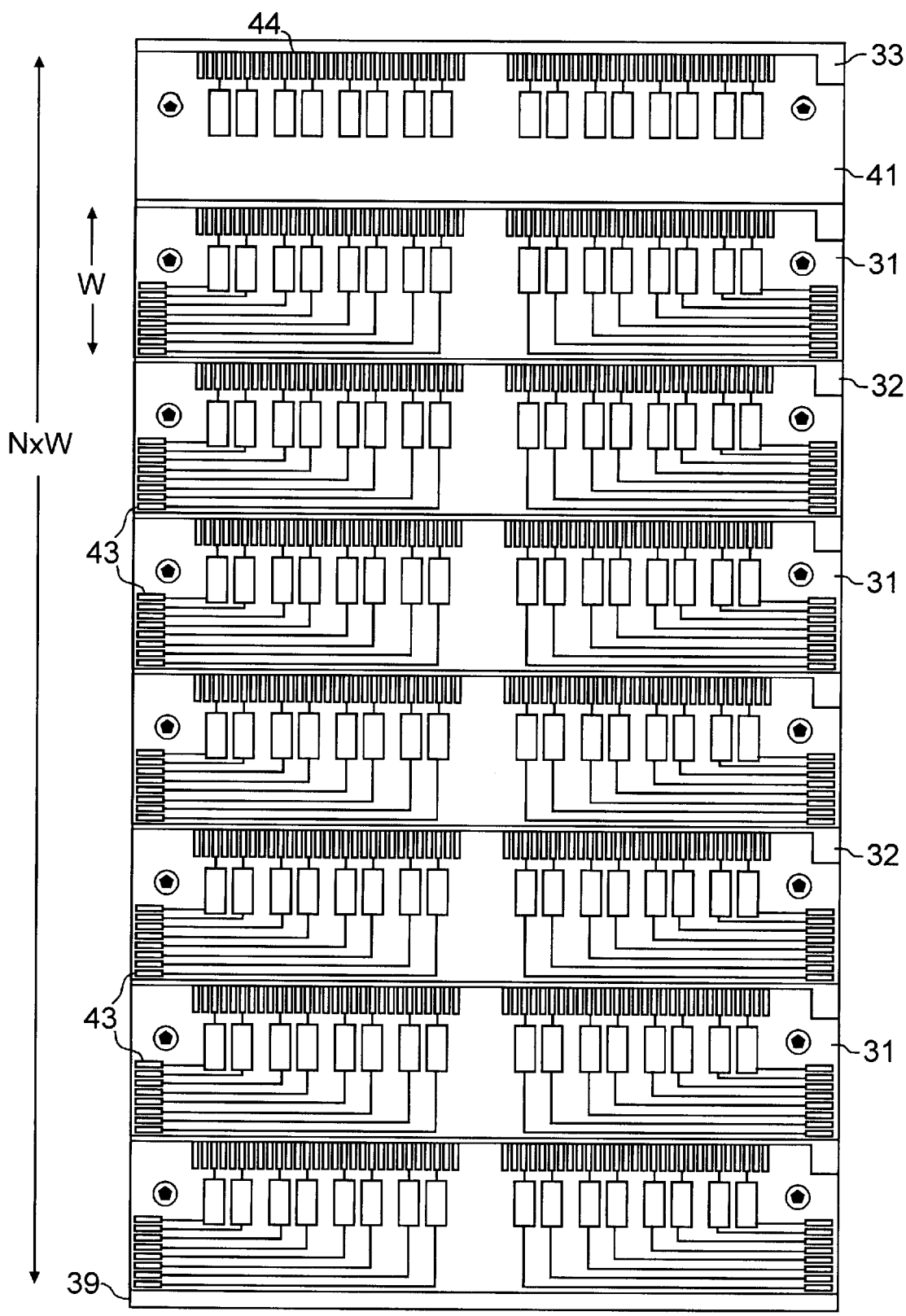
FIG. 5 is a view similar to that of FIG. 4 showing an alternative embodiment of the invention.

After final testing the cards 31 (and 41) are singulated from the common test panel 32 by cutting along the peripheral edges of the card sites. In this step the added arrays of test contacts are left behind. If desired for further or future testing, the row of test contacts can be located within the boundaries of the card sites as shown in FIG. 5. This arrangement offers the feature that the edge of the card can be made free of electrical runners. It also allows the panel width to be the same as the width of the cards thus eliminating the need for cutting the sides of the common processing panel in the singulation operation. The top edge 38 and the bottom edge 39 of the common processing panel can also be omitted in this embodiment if desired.

As pointed out above, the printed circuit boards typically used in these assemblies are multilevel structures, and the circuits shown in these figures may or may not occupy the same level. It is preferred in several of the embodiments shown of contemplated, that the printed circuit interconnections for the added test contacts occupy a buried level of a multilevel structure.

Figure 6:
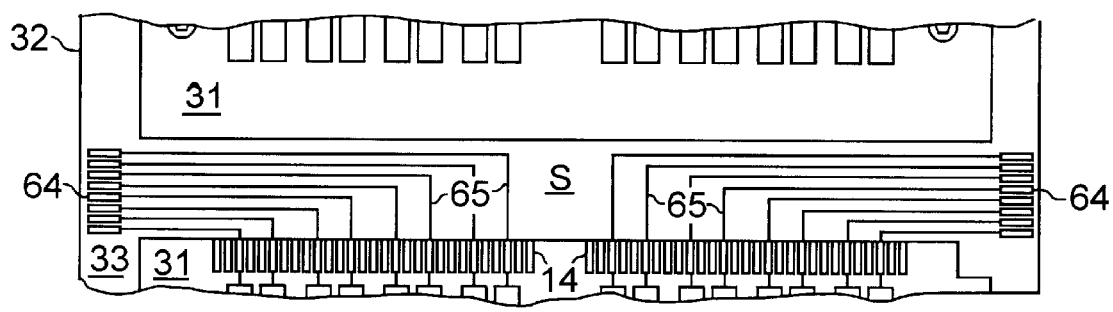
FIG. 6 is a view similar to that of FIG. 3 showing an alternative arrangement of the array of test contacts in another embodiment of the invention.

Another embodiment, in which the entire added circuitry for the array of test contacts is located outside the boundaries of the card is shown in FIG. 6. Here the array of test contacts 64 is located along the edge of the process panel, as in FIG. 4, but is removed to an area of the process panel between the card sites 31, as shown in the Figure. The interconnections 65 in this embodiment run directly from the arrays of permanent contacts 14, and the interconnections also occupy a space on the process panel between the card sites 31. When these cards 31 are singulated, the added array of test contacts and the added interconnections for the test contacts are all eliminated, essentially without a trace. This feature is attractive from a customer standpoint and makes the arrangement of FIG. 6 a preferred embodiment if the expense of added process panel area to accommodate the added contacts and interconnections is otherwise acceptable.

Figure 7:
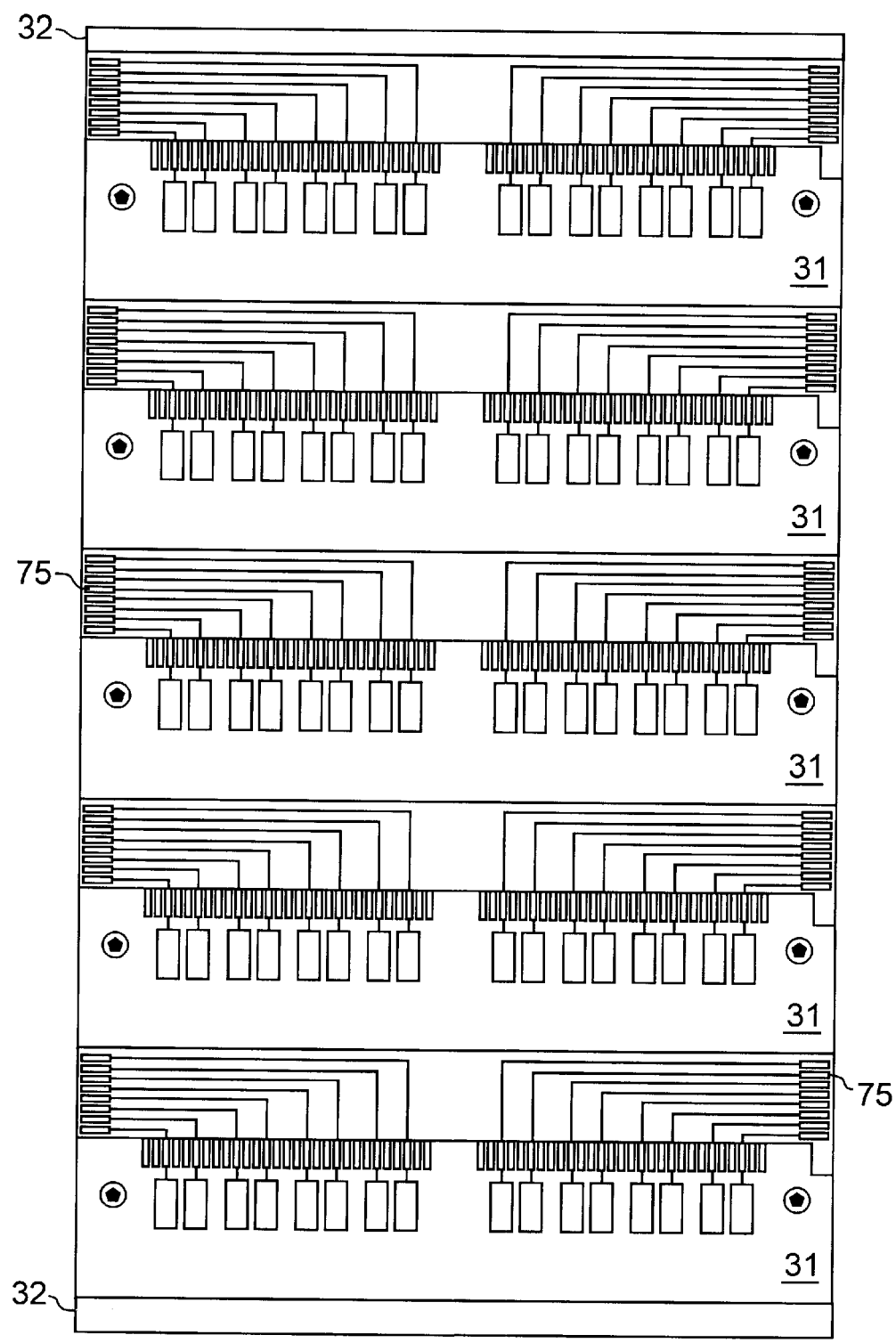
FIG. 7 is a view of the entire process panel, similar to the views of FIGS. 4 and 5, showing an alternative to the embodiment of FIG. 6.

An alternative arrangement to that of FIG. 6 is shown in FIG. 7. In this embodiment, the primary advantages pointed out in connection with the embodiments of FIGS. 4 and 5, namely locating the array of test contacts on the processing panel so that they are eliminated automatically during singulation (FIG. 4), and having the width dimension of the processing panel no greater than the width of the PC cards (FIG. 5), are both realized in the embodiment of FIG. 7. Here the arrays of test contacts 75 are located within the portion of the process panel 32 that corresponds with the width of the card sites 31. Thus the process board may have the same width dimension as the cards sites which simplifies the singulation operation.

Figure 8:
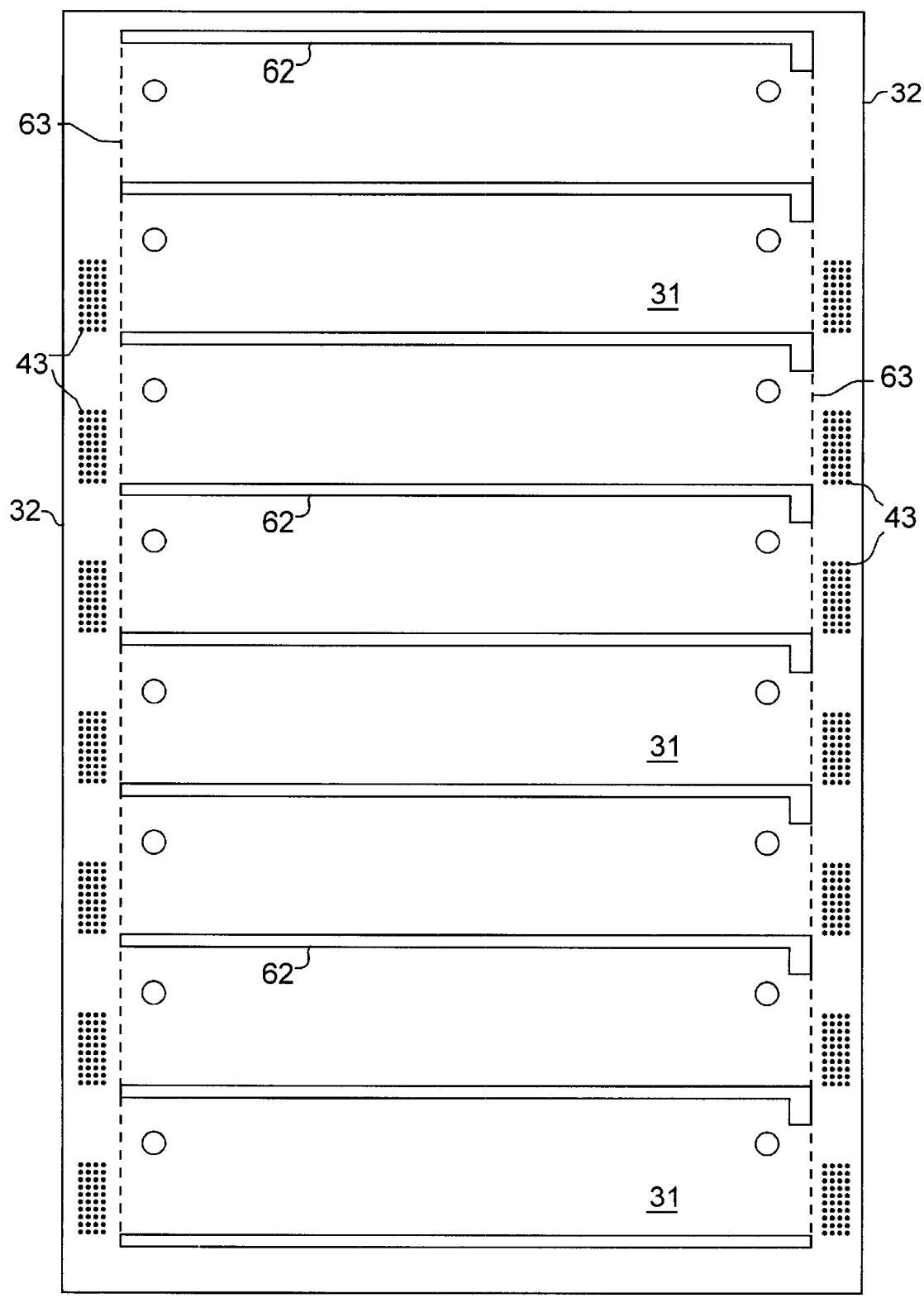
FIG. 8 is a view of an alternative form of a common processing panel.

Referring back to the embodiments of FIGS. 4 and 6, the singulation step can be facilitated by partially precutting the common processing panel 32. A partially precut common processing board is shown in FIG. 8. The cutout sections 62 at the top and bottom boundaries of the PC card sites 31 form the final top and bottom edges of the PC cards. Using the precut panels, the singulation operation requires cuts only along the sides of the cards. These cuts are indicated by the dashed lines 63. The array of test contacts, shown in phantom at 43, are cut away in the singulation operation as described earlier in connection with FIG. 4.

Figure 9:
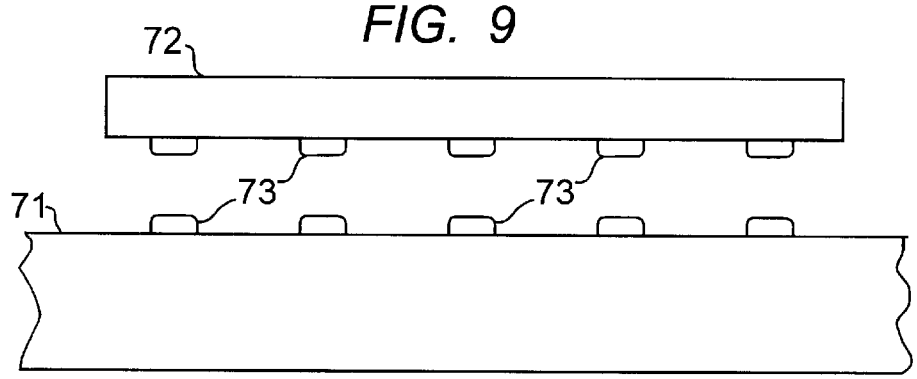
FIG. 9 is a view of a flip-chip component package prior to soldering.
Figure 10:
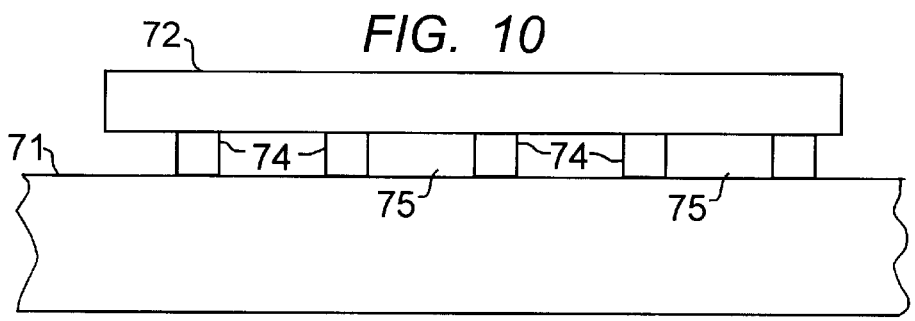
FIG. 10 is a continuation of FIG. 9 in the process sequence showing the component package panel mounted.
Figure 11:
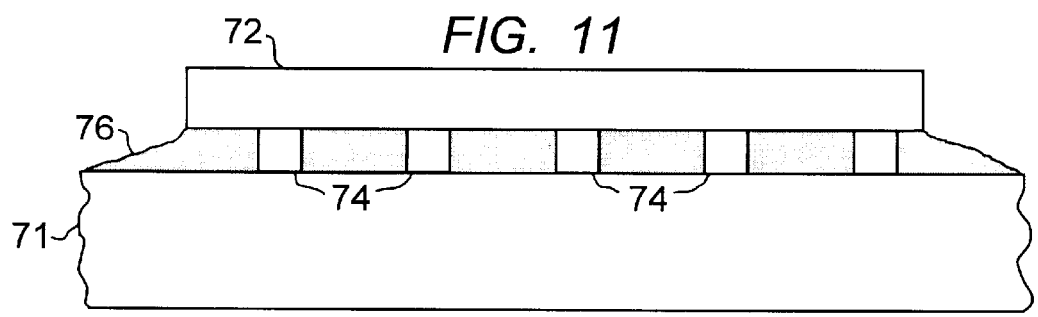
FIG. 11 is a continuation of FIG. 10 in the process sequence showing the epoxy underfill.

Also mentioned earlier is the advantage of batch testing when a final packaging operation advantageously follows final test. This sequence is illustrated by FIGS. 9–11. In FIG. 9, the printed circuit card 71 and the flipchip 72 are provided with solder bumps 73 prior to final assembly. The PC card 71 corresponds generally to the printed circuit board at the card site 31 in FIG. 3, and the flip-chip 72 corresponds generally to the component packages 12 of FIG. 3. In FIG. 10 these elements are shown after the soldering operation resulting in solder pillars 74 that attach the flip-chips to the PC card site leaving gaps 75 therebetween. These gaps are underfilled with epoxy 76 as shown in FIG. 11. The epoxy underfill is needed to prevent failure of the solder attachments due to differential thermal expansion between the board 71 and the component package 72. However, after the epoxy underfill is applied it becomes difficult if not impractical to replace defective component packages during final assembly. Therefore it is important that final testing, including burn-in if required, be completed prior to applying the epoxy underfill. This sequence of operations, i.e. testing before underfilling is made possible by this invention.

Reference in the foregoing description to burn-in testing will be understood by those skilled in the art to mean applying an electrical bias or signal to the components with the components subjected to elevated temperatures or to elevated temperatures combined with elevated humidity.

It will also be understood by those skilled in the art that the techniques described above are applicable to both single sided and double sided PC cards.

The second (added) linear array of test contacts that forms an essential feature of the invention is shown in the embodiments above occupying the edge portion of the common processing panel on both sides of the PC card sites. It can be envisioned that the number of test contacts required for adequately testing the PC cards could be arrayed along only one side of the PC card site, and all of the necessary runners routed in one direction to that side of the card. Accordingly the invention is to be construed as including this option. The electrical tests selected for the components may involve all of the I/O contacts, or may require fewer contacts. Thus the second array of test contacts may or may not replicate the array of permanent I/O contacts.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for manufacturing a printed circuit board said printed circuit board having a multiplicity N of printed circuit card sites (31), where N is at least 3, each of said printed circuit card sites having a length and a width and a side L corresponding to the length and a side W corresponding to the width, and said printed circuit board having a length approximately equal to N×W, comprising the steps of;

a. forming a plurality of electrical component attachment regions (12) on at least one side of each printed circuit card site, each of said regions comprising a plurality of IC device contacts for electrically contacting an IC device, said plurality of IC device contacts comprising a first IC device contact, a second IC device contact, and a third IC device contact, b. forming a length linear array of separate electrical contacts (14) along side L of each printed circuit card site, said length linear array of separate electrical contacts comprising a first length array contact, a second length array contact, and a third length array contact, c. forming a width linear array of separate electrical contacts (34) along side W of each printed circuit card site, said width linear array of separate electrical contacts comprising a first width array contact, a second width array contact, and a third width array contact, d. forming a first plurality of printed circuit interconnections (13), a first one of said first plurality of printed circuit interconnections interconnecting said first IC device contact with said first length array contact, a second one of said first plurality of printed circuit interconnections interconnecting said second IC device contact with said second length array contact, a third one of said first plurality of printed circuit interconnections interconnecting said third IC device contact with said third length array contact, e. forming a second plurality of printed circuit interconnections (35), a first one of said second plurality of printed circuit interconnections interconnecting said first IC device contact with said first width array contact, a second one of said second plurality of printed circuit interconnections interconnecting said second IC device contact with said second width array contact, a third one of said second plurality of printed circuit interconnections interconnecting said third IC device contact with said third width array contact, f. attaching a plurality of electrical components to said plurality of electrical component attachment regions, g. electrically testing the plurality of electrical components by applying test signals to said width linear array of electrical contacts, and h. singulating the printed circuit card sites by cutting the printed circuit board around the printed circuit card sites to form a plurality of individual printed circuit cards.

2. The method of claim 1 including an additional step, after step g., of applying epoxy to the electrical components to secure them to the printed circuit board.

3. The method of claim 1 in which the step of electrically testing the plurality of electrical components includes heating the components to an elevated temperature while applying an electrical bias to the components.

4. A method for manufacturing printed circuit cards from a printed circuit board, said printed circuit board having a multiplicity N of printed circuit card sites (31), where N is at least 3, each of said printed circuit card sites having a side L corresponding to the length and a side W corresponding to the width, and said printed circuit board having a length approximately equal to N×W, and a width having a first portion approximately equal to L plus at least one edge portion (32) extending beyond said first portion along the side W of the printed circuit card sites, comprising the steps of:

a. forming on each of said printed circuit sites;
      i. a plurality of electrical component attachment regions (12) each of said regions comprising a plurality of IC device contacts adapted for electrically contacting a plurality of electrical components, said plurality of IC device contacts comprising a first IC device contact, a second IC device contact, and a third IC device contact,
      ii. a length linear array of electrical contacts (14) along said side L of the printed circuit card site, said length linear array of electrical contacts comprising a first length array contact, a second length array contact, and a third length array contact,
      iii. a first plurality of printed circuit interconnections (13), a first one of said first plurality of printed circuit interconnections interconnecting said first IC device contact with said first length array contact, a second one of said first plurality of printed circuit interconnections interconnecting said second IC device contact with said second length array contact, a third one of said first plurality of printed circuit interconnections interconnecting said third IC device contact with said third length array contact,
   b. forming at least two width linear arrays of electrical contacts (34) on at least one edge portion of the printed circuit board adjacent to the printed circuit card sites with the at least two width linear.
   c. forming a second plurality of printed circuit interconnections (35), a first one of said second plurality of printed circuit interconnections interconnecting said first IC device contact with said first width array contact, a second one of said second plurality of printed circuit interconnections interconnecting said second IC device contact with said second width array contact, a third one of said second plurality of printed circuit interconnections interconnecting said third IC device contact with said third width array contact,
   d. attaching a plurality of electrical components to said plurality of electrical component attachment regions,
   e. electrically testing the plurality of electrical components by applying test signals to said width linear arrays of electrical contacts, and
   f. singulating the printed circuit card sites by cutting the printed circuit board around the printed circuit card sites to form a plurality of individual printed circuit cards.

5. The method of claim 4 in which the printed circuit board is precut at least partially along the sides L of the printed circuit card sites, and the step of singulating the printed circuit cards comprises cutting along at least a part of the sides W of the printed circuit card sites.

6. The method of claim 4 in which the step of electrically testing the electrical components includes a burn-in test.

7. The method of claim 4 including an additional step, after step d., of completing packaging of the electrical components.

8. The method of claim 7 in which the step of completing the packaging of the electrical components includes applying an adhesive to the components.

9. The method of claim 4 in which the printed circuit cards are single in-line memory modules.

* * * * *